United States Patent [19]
Park et al.

[11] Patent Number: 5,712,205
[45] Date of Patent: Jan. 27, 1998

[54] SEMICONDUCTOR ISOLATION METHOD

[75] Inventors: In Ok Park; Yung Seok Chung; Eui Sik Kim, all of Bubaleub, Rep. of Korea

[73] Assignee: Hyundai Electronics Industries Co., Ltd., Rep. of Korea

[21] Appl. No.: 747,024

[22] Filed: Nov. 7, 1996

[30] Foreign Application Priority Data

Nov. 21, 1995 [KR] Rep. of Korea .................. 1995-42466

[51] Int. Cl.$^6$ .................................. H01L 21/76
[52] U.S. Cl. .................. 438/425; 438/426; 438/424; 438/298
[58] Field of Search .................. 437/69, 70, 72, 437/73, 67; 438/424, 425, 426, 294, 296, 297, 298

[56] References Cited

U.S. PATENT DOCUMENTS

| | | | |
|---|---|---|---|
| 4,980,311 | 12/1990 | Namose | 437/72 |
| 5,112,772 | 5/1992 | Wilson et al. | 437/72 |
| 5,116,779 | 5/1992 | Iguchi | 437/69 |
| 5,369,051 | 11/1994 | Rao et al. | 437/69 |
| 5,455,438 | 10/1995 | Hashimoto et al. | 257/391 |

Primary Examiner—Trung Dang
Attorney, Agent, or Firm—Blakely, Sokoloff, Taylor & Zafman

[57] ABSTRACT

The present invention relates to a semiconductor isolation method for high density semiconductor(devices of which the isolation pitch is below 0.5 μm. The present invention provides the semiconductor isolation method to improve the isolating characteristics of the semiconductor device by separately performing the isolation process for the area where the isolation pitch is wide from the area where it is narrow. In accordance with the present invention, there is disclosed a semiconductor isolation method including the steps for forming a pad oxide layer and a nitride layer on a semiconductor substrate having an area of relatively narrow isolation pitch and an area of relatively wide isolation pitch, selectively etching the nitride layer and the pad oxide layer on the area of relatively narrow isolation pitch to expose the semiconductor substrate thereunder and forming a trench into a predetermined area of the exposed semiconductor substrate, forming an insulating layer on the resulting structure, removing the insulating layer, whereby the insulating layer remains in the trench, selectively etching the nitride layer on the area of relatively wide isolation pitch, and forming a field oxide on the area where the nitride layer is removed.

7 Claims, 5 Drawing Sheets

(a)

(b)

(c)

(d)

(e)

(a)

(b)

(c)

(d)

(e)

(f)

SEMICONDUCTOR ISOLATION METHOD

FIELD OF THE INVENTION

This invention relates to a semiconductor isolation method, and more particularly to a semiconductor isolation method to improve the isolating characteristics of the semiconductor device.

BACKGROUND OF THE INVENTION

The conventional isolation method will be described hereinafter with reference to FIGS. 1A. to 1E, which are simplified cross sectional views illustrating the process flow of the conventional poly buffered LOCOS("PBL") method.

First, referring to FIG. 1A, a pad oxide layer 2 is formed on the substrate 1. This pad oxide layer 2 is used to prevent the stress of the nitride layer 4 during the oxidation process from affecting the silicon substrate 1. Then, a pad polysilicon layer 3 is formed on the pad oxide layer 2 in order to reduce the above mentioned stress of the nitride layer 4 and to decrease the length of the bird's beak. Then, the nitride layer 4 is formed on the pad polysilicon layer 3. This nitride layer 4 is used as an oxidation masking layer on an active area to selectively form a field oxide layer onto the predetermined isolation area.

Next, referring to FIG. 1B, the nitride layer 4 is selectively etched by dry etching to remain on the active area.

Next, referring to FIG. 1C, impurities of the same type of the substrate impurities, for example boron, are injected into the field area of the NMOS area with a predetermined patterned mask 5A, in order to improve the insulating characteristic of the field area by increasing the field threshold voltage of the channel of the field area.

Next, referring to FIG. 1D, after removing the mask 5A and forming a predetermined patterned mask 5B, impurities of the same type of the other substrate impurities, for example phosphorus, are injected into the field area of the PMOS area with the mask 5B in order to improve the insulating characteristic of the field area by increasing the field threshold voltage of the channel of the field area.

Next, referring to FIG. 1E, after removing the masks 5A, 5B, a field oxidation process is performed to form a thick field oxide 8 onto the predetermined isolation area and the conventional isolation process is completed.

However, according to the above mentioned conventional PBL method, the narrower the isolation pitch becomes, especially in the cell area, the worse the insulating characteristic of the field oxide because of the thinning effect(refer to 'B' in FIG. 1E) due the abnormal oxidation by the window effect, and the narrower the active area due to the longer bird's beak(refer to 'A' in FIG. 1E).

Also, the surface planarization characteristic is decreased because of the topological difference between the active area and the isolation area where the field oxide grows.

SUMMARY OF THE INVENTION

Therefore, the present invention has been made in view of the above mentioned problem. The present invention provides a semiconductor isolation method of improved isolating characteristics by a combined isolation process which includes the steps for performing a conventional LOCOS on a peripheral area where the isolation pitch is narrow and performing a trench isolation process with a chemical mechanical polishing("CMP") on a cell area where the isolation pitch is wide.

In accordance with the present invention, there is disclosed a semiconductor isolation method including the steps for forming a pad oxide layer and a nitride layer on a semiconductor substrate having an area of relatively narrow isolation pitch and an area of relatively wide isolation pitch, selectively etching the nitride layer and the pad oxide layer on the area of relatively narrow isolation pitch to expose the semiconductor substrate thereunder and forming a trench into a predetermined area of the exposed semiconductor substrate, forming an insulating layer on the resulting structure, removing the insulating layer, whereby the insulating layer remains in the trench, selectively etching the nitride layer on the area of relatively wide isolation pitch, and forming a field oxide on the area where the nitride layer is removed.

BRIEF DESCRIPTION OF THE DRAWINGS

A further understanding of the nature and advantage of the present invention will become apparent by reference to the remaining portions of the specification and drawings.

DETAILED DESCRIPTION OF THE PREFERRED EMBODIMENT

A detailed description of an embodiment according to the present invention will be given below with reference to FIGS. 2A to 2F.

Figure 1:
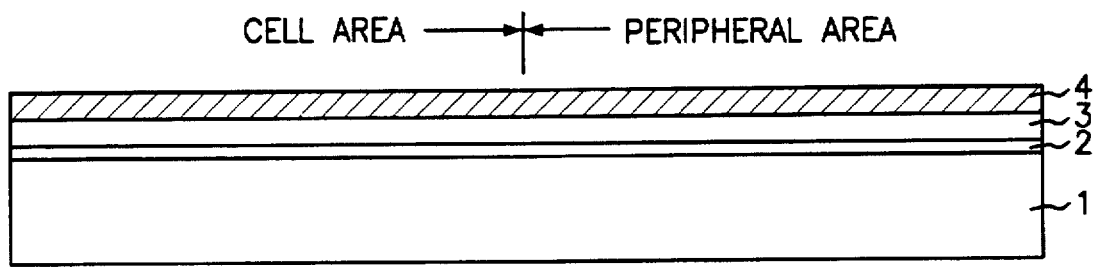
FIGS. 1A to 1E are simplified cross sectional views which illustrate a conventional semiconductor isolation method.
Figure 1:
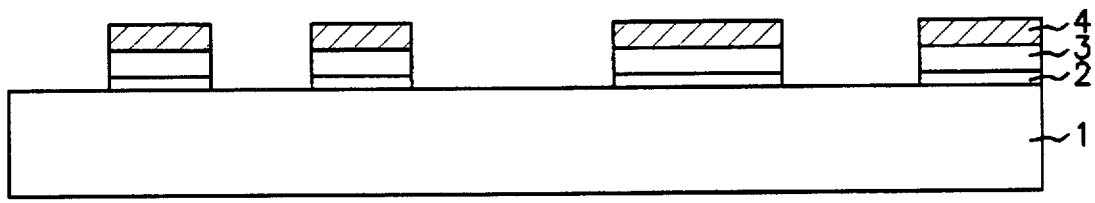
Figure 1:
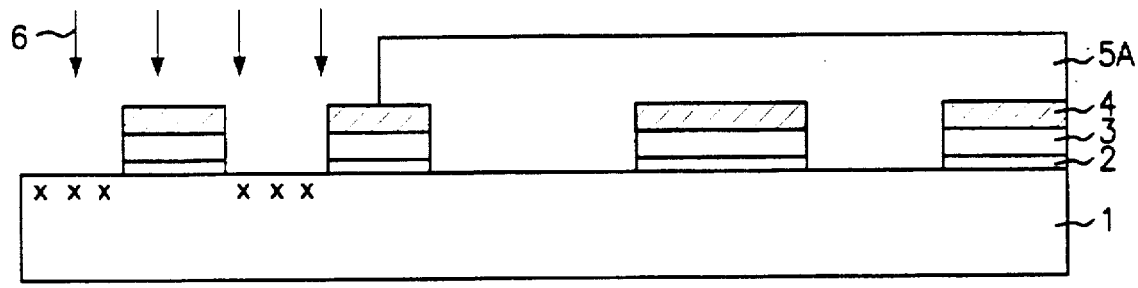
Figure 1:
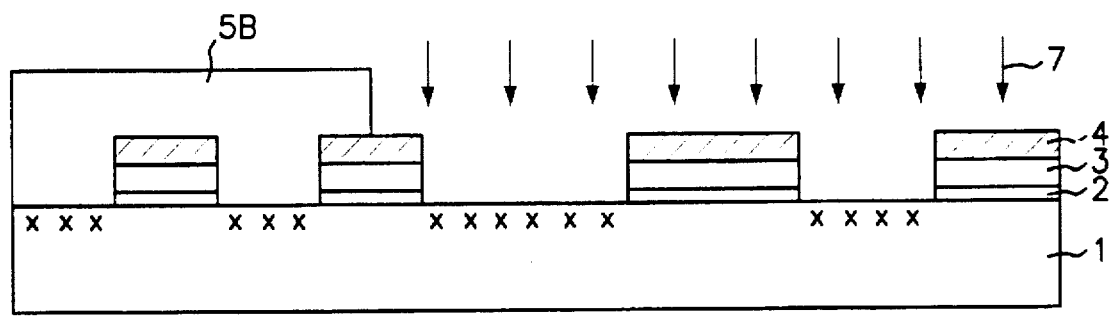
Figure 1:
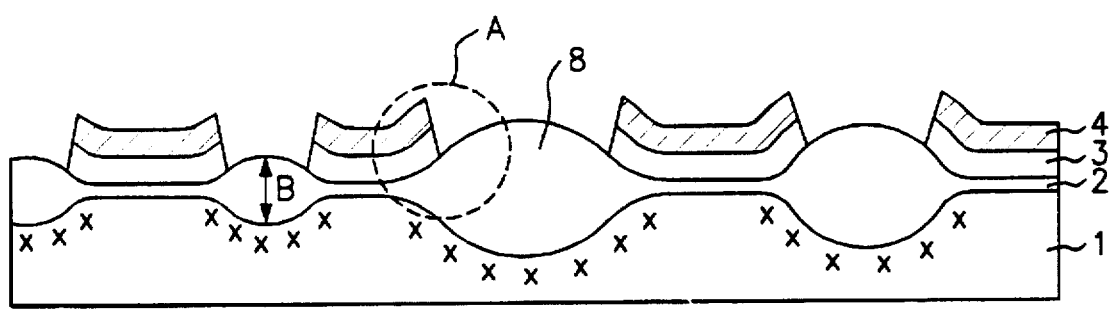
Figure 2:
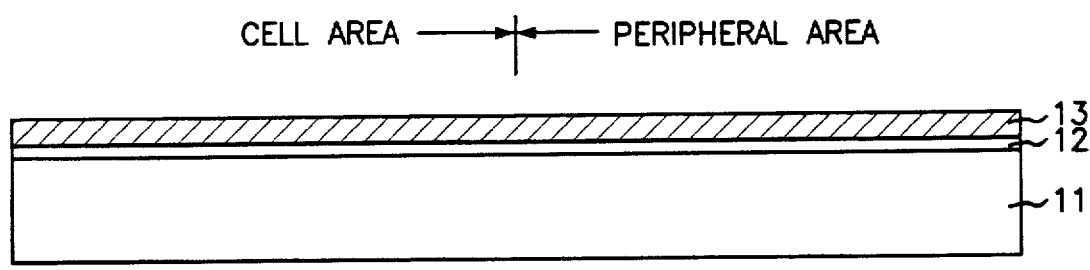
FIGS. 2A to 2F are simplified cross sectional views which illustrate a semiconductor isolation method according to the present invention.
Figure 2:
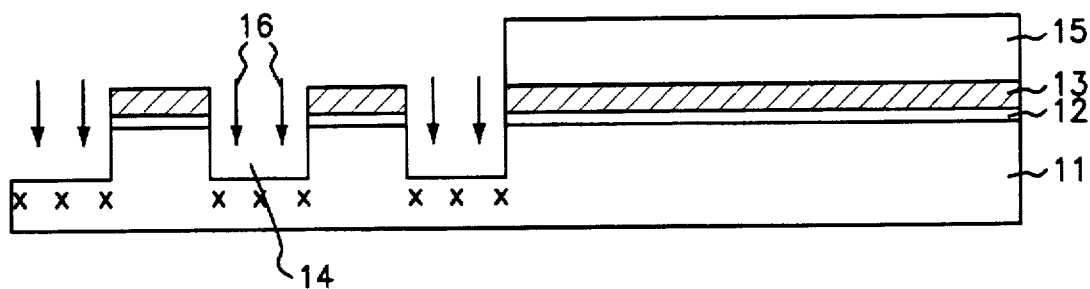
Figure 2:
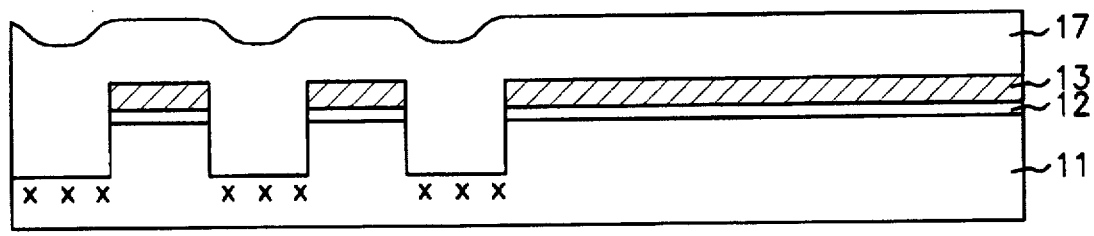
Figure 2:
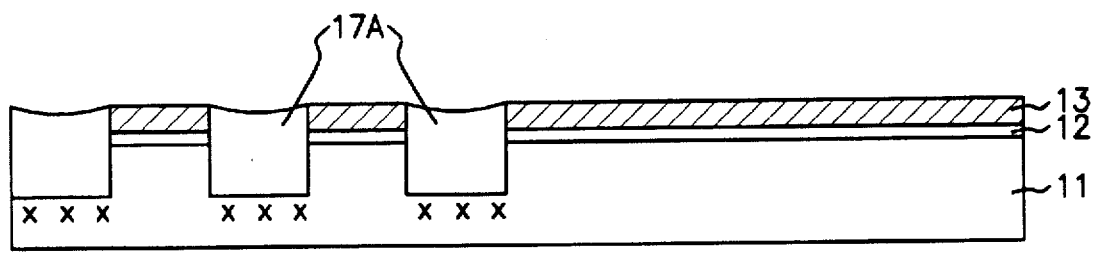
Figure 2:
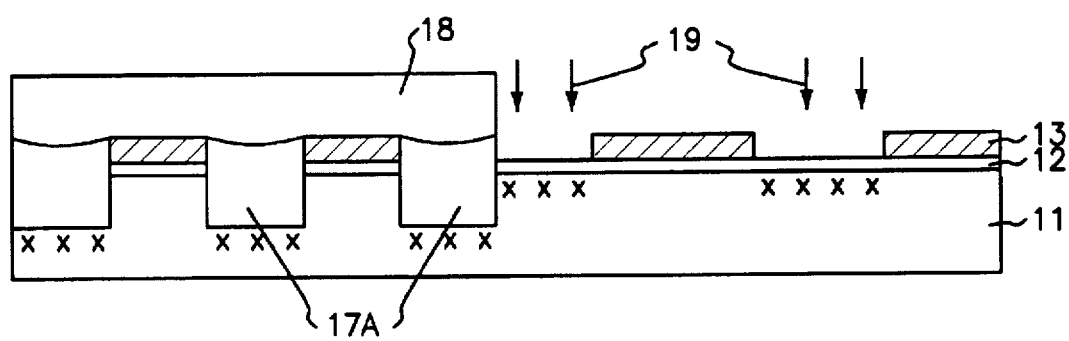
Figure 2:
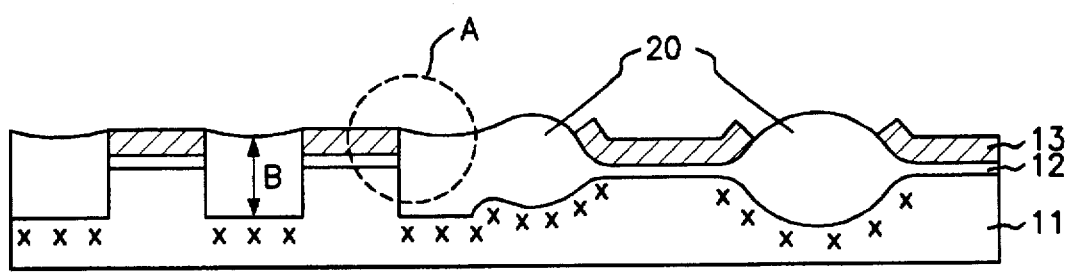

First, referring to FIG. 2A, a pad oxide layer 12 is formed on a silicon substrate 11. Next, a nitride layer 13 is formed on the pad oxide layer 12. The pad oxide layer 12 is used to prevent the stress of the nitride layer 13 from affecting the substrate in the field oxidation process at a high temperature. The nitride layer 13 is used as an oxidation masking layer to selectively form a field oxide layer on the isolation area.

Next, referring to FIG. 2B, a first masking layer, for example a photo resist layer 15, is selectively formed on a peripheral area to expose a cell area where the isolation pitch is narrow. Then, the nitride layer 13 and the pad oxide layer 12 on the cell area are selectively removed from the predetermined isolation area by dry etching to expose a surface of the substrate 11 of the isolation area. Then, a trench 14 is formed into a predetermined area of the exposed substrate 11 by etching. Impurities of the same type of the substrate of the cell area, for example boron, are then injected in order to increase the field threshold voltage of the NMOS area in the cell area.

Next, referring to FIG. 2C, after removing the photo resist layer 15, a thick oxide layer 17 is formed on the resulting structure by the chemical vapor deposition("CVD").

Next, referring to FIG. 2D, a CMP process is performed to remove the oxide layer 17 on the nitride layer 13, SO that the oxide layer 17 inside the trench 14 is still remaining. During the CMP process, the oxide layer 17 is effectively removed with the nitride layer 13 which is used as an etch stop layer.

Next, referring to FIG. 2E, a second masking layer, for example photo resist layer 18, is selectively formed on the cell area to expose the peripheral area where the isolation pitch is wide. Then, the nitride layer 13 on the peripheral area is selectively removed from the predetermined isolation area by dry etching. Another impurities of the same type of the substrate of the peripheral area, for example phosphorus, are then injected in order to increase the field threshold voltage of the PMOS area in the peripheral area.

Next, referring to FIG. 2F, after removing the photo resist 18, a field oxide 20 is formed on the predetermined isolation area by the field oxidation process. A thick field oxide is formed on the peripheral area by this field oxidation process. In contrast to the peripheral area, as the thick oxide remains in the trench 14 in the cell area, no oxidation reaction occurs in the cell area. So, bird's beak is substantially not grown, and the topological difference is substantially removed, so that improved surface planarization characteristic can be achieved. Also, the characteristics of the field oxide in the cell area is improved by achieving a denser field oxide during the high temperature field oxidation process.

As described above, according to the present invention, a thick field oxide is formed on the peripheral area, where the isolation pitch is wide, by the conventional LOCOS. A trench is formed on the cell area where the isolation pitch is narrow, for example the isolation pitch is below 0.5 μm, and the field oxide is formed by applying the CMP process to the CVD oxide. Therefore, the thinning effect can be avoided and the isolation characteristics are improved.

In addition, there is substantially no oxidation reaction in the cell area while a thick field oxide is formed in the peripheral area by high temperature oxidation process because of the thick CVD oxide in the trench 14. Therefore, the areal decrease in active area due to the bird's beak can be avoided.

Also, in the conventional isolation method, three(3)mask processes are required including the nitride layer patterning, the field injection in the NMOS area and the field injection in the PMOS area. However, according to the present invention, the isolation process can be performed with two(2) mask processes which provides an increased productivity and a cost-effectiveness.

Although the preferred embodiment of the present invention has been disclosed for illustrative purposes, those skilled in the art will appreciate that various modifications, additions and substitutions are possible, without departing from the scope and the spirit of the present invention as disclosed in the accompanying claims.

What is claimed is:

1. A semiconductor isolation method comprising the steps for:

forming a pad oxide layer and a nitride layer on a semiconductor substrate comprising an area of relatively narrow isolation pitch and an area of relatively wide isolation pitch;

selectively etching said nitride layer and said pad oxide layer on said area of relatively narrow isolation pitch to expose said semiconductor substrate thereunder and forming a trench into a predetermined area of said exposed semiconductor substrate;

forming a chemical vapor deposition oxide layer on the resulting structure;

removing said chemical vapor deposition oxide layer using a chemical-mechanical polish process and using said nitride layer as an etch stop layer;

selectively etching said nitride layer on said area of relatively wide isolation pitch; and forming a field oxide using thermal oxidation said area where said nitride layer is removed.

2. The method as claimed in claim 1, wherein said area of relatively narrow isolation pitch is a cell area.

3. The method as claimed in claim 2, wherein said isolation pitch in said cell area is below 0.5 μm.

4. The method as claimed in claim 1, wherein said area of relatively wide isolation pitch is a peripheral area.

5. The method as claimed in claim 1, wherein said trench is formed on a predetermined isolation area in said area of relatively narrow isolation pitch.

6. The method as claimed in claim 1, wherein said insulating layer becomes denser during the step for forming said field oxide.

7. The method as claimed in claim 1, wherein said method further comprising the step for performing impurity injection process after the steps fox forming a trench and for selectively etching said nitride layer on said area of relatively wide isolation pitch.

* * * * *